United States Patent
Horng et al.

(10) Patent No.: US 6,590,751 B1
(45) Date of Patent: Jul. 8, 2003

(54) ANISOTROPIC MAGNETORESISTIVE (MR) SENSOR ELEMENT WITH ENHANCED MAGNETORESISTIVE (MR) COEFFICIENT

(75) Inventors: Cheng T. Horng, San Jose, CA (US); Rongfu Xiao, Fremont, CA (US); Ru-Ying Tong, San Jose, CA (US); Jei-Wei Chang, Cupertino, CA (US); Kochan Ju, Fremont, CA (US); Simon H. Liao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/408,700

(22) Filed: Sep. 30, 1999

(51) Int. Cl.[7] .............................. G11B 5/127; G11B 5/33
(52) U.S. Cl. ...................................................... 360/325
(58) Field of Search ................................ 360/325, 327, 360/324.12, 313, 110, FOR 213

(56) References Cited

U.S. PATENT DOCUMENTS

| | | | |
|---|---|---|---|
| 5,268,806 A | 12/1993 | Gouban et al. | 360/322 |
| 5,701,223 A | 12/1997 | Fontana, Jr. et al. | 360/324.11 |
| 5,729,409 A | * 3/1998 | Ohashi et al. | 360/327 |
| 5,731,936 A | 3/1998 | Lee et al. | 360/327.22 |
| 5,763,108 A | 6/1998 | Chang et al. | 428/694 R |
| 5,768,071 A | 6/1998 | Lin | 360/324.11 |
| 5,896,252 A | * 4/1999 | Kanai | 360/324.12 |
| 6,016,241 A | * 1/2000 | Coffey et al. | 360/324 |
| 6,046,892 A | * 4/2000 | Aoshima et al. | 360/324.11 |

\* cited by examiner

Primary Examiner—Robert S. Tupper
Assistant Examiner—Julie Anne Watko
(74) Attorney, Agent, or Firm—George O. Saile; Stephen B. Ackerman

(57) ABSTRACT

A method for forming an anisotropic magnetoresistive (MR) sensor element, and the anisotropic magnetoresistive (MR) sensor element formed in accord with the method. In accord with the method, there is first provided a substrate. There is then formed over the substrate a seed layer formed of a magnetoresistive (MR) resistivity sensitivity enhancing material selected from the group consisting or nickel-chromium alloys and nickel-iron-chromium alloys. There is then formed over the seed layer a nickel oxide material layer. Finally, there is then formed over the nickel oxide material layer a magnetoresistive (MR) layer. The method contemplates the anisotropic magnetoresistive (MR) sensor element formed in accord with the method. The nickel oxide material layer provides the anisotropic magnetoresistive (MR) sensor element with an enhanced magnetoresistive (MR) resistivity sensitivity.

24 Claims, 1 Drawing Sheet

ANISOTROPIC MAGNETORESISTIVE (MR) SENSOR ELEMENT WITH ENHANCED MAGNETORESISTIVE (MR) COEFFICIENT

CROSS-REFERENCE TO RELATED APPLICATIONS

This application is related to co-pending and co-assigned: (1) application Ser. No. 09/236,488, filed Jan. 25, 1999, titled "Giant Magnetoresistive (GMR) Sensor Element With Enhanced Magnetoresistive (MR) Resistivity Sensitivity"; and (2) application Ser. No. 09/408,703, filed on an even date herewith, titled "Giant Magnetoresistive (GMR) Sensor Element With Enhanced Magnetoresistive (MR) Coefficient."

BACKGROUND OF THE INVENTION

1. Field of the Invention

The present invention relates generally to magnetoresistive (MR) sensor elements employed within magnetic data storage and retrieval. More particularly, the present invention relates to enhanced magnetoresistive (MR) resistivity sensitivity anisotropic magnetoresistive (MR) sensor elements employed within magnetic data storage and retrieval.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically determined as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data from and into the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data from and into a magnetic data storage medium, it is known in the art of magnetic read-write head fabrication that magnetoresistive (MR) sensor elements employed within magnetoresistive (MR) read-write heads are generally superior to other types of magnetic sensor elements when employed in retrieving digitally encoded magnetic data from a magnetic data storage medium. In that regard, magnetoresistive (MR) sensor elements are generally regarded as superior since magnetoresistive (MR) sensor elements are known in the art to provide high output digital read signal amplitudes, with good linear resolution, independent of the relative velocity of a magnetic data storage medium with respect to a magnetoresistive (MR) read-write head having the magnetoresistive (MR) sensor element incorporated therein.

Within the general category of magnetoresistive (MR) sensor elements, anisotropic magnetoresistive (MR) sensor elements are presently of considerable interest insofar as anisotropic magnetoresistive (MR) sensor elements have found widespread use in various magnetic data storage and transduction applications, and in particular digitally encoded magnetic data storage and transduction applications. Within the context of the present disclosure, anisotropic magnetoresistive (MR) sensor elements are intended as magnetoresistive (MR) sensor elements fabricated employing either a single magnetoresistive (MR) sensing layer or a multiplicity of magnetoresistive (MR) sensing layers which are separated by dielectric spacer layers, and where a magnetoresistive (MR) effect within such an anisotropic magnetoresistive (MR) sensor element derives from magnetically encoded data flux perturbation of a magnetically aligned domain within either the single magnetoresistive (MR) sensing layer or the multiplicity of magnetoresistive (MR) sensing layers. Such anisotropic magnetoresistive (MR) sensor elements include, but are not limited to single stripe magnetoresistive (SSMR) sensor elements, soft adjacent layer (SAL) magnetoresistive (MR) sensor elements and dual stripe magnetoresistive (DSMR) sensor elements.

Within magnetoresistive (MR) sensor element fabrication, including but not limited to anisotropic magnetoresistive (MR) sensor element fabrication, it is particularly desirable to fabricate magnetoresistive (MR) sensor elements with enhanced levels of magnetoresistive (MR) resistivity sensitivity. For purposes of clarity, and within the context of the present disclosure, magnetoresistive (MR) resistivity sensitivity is intended as a measure of proportion of resistance change normalized to an absolute resistance of a magnetoresistive (MR) sensor element (i.e. dR/R) when measuring a magnetic signal within a magnetic data storage medium while employing the magnetoresistive (MR) sensor element. The magnetoresistive (MR) resistivity sensitivity of a magnetoresistive (MR) sensor element is alternatively known as the magnetoresistive (MR) coefficient of the magnetoresistive (MR) sensor element. Magnetoresistive (MR) sensor elements exhibiting enhanced magnetoresistive (MR) resistivity sensitivity are desirable within the art of magnetoresistive (MR) sensor element fabrication since such enhanced magnetoresistive (MR) resistivity sensitivity clearly inherently allows for detection within a magnetic data storage medium of weaker magnetic signals with increased linear density and thus also inherently allows for an increased areal density of the magnetic data storage medium within a magnetic data storage enclosure which employs the magnetoresistive (MR) sensor element which exhibits the enhanced magnetoresistive (MR) resistivity sensitivity.

It is thus towards the goal of forming for use within magnetic data storage and retrieval anisotropic magnetoresistive (MR) sensor elements, such as but not limited to single stripe magnetoresistive (SSMR) sensor elements, soft adjacent layer (SAL) magnetoresistive (MR) sensor elements and dual stripe magnetoresistive (DSMR) sensor elements, with enhanced magnetoresistive (MR) resistivity sensitivity, that the present invention is directed.

Various magnetic sensor elements, including but not limited to anisotropic magnetoresistive (MR) sensor elements, which possess desirable properties have been disclosed within the art of magnetic sensor element fabrication, including but not limited to anisotropic magnetoresistive (MR) sensor element fabrication.

For example, Goubau et al., in U.S. Pat. No. 5,268,806, disclose a magnetoresistive (MR) sensor element having a conductor lead structure which remains stable not only during processing when fabricating the magnetoresistive (MR) sensor element, but also over the useful operational life of the magnetoresistive (MR) sensor element. The magnetoresistive (MR) sensor element employs a conductor lead structure comprising: (1) a seed layer contacting a magnetoresistive (MR) layer within the magnetoresistive (MR) sensor element, where the seed layer is formed from a material selected from the group consisting of chromium, tungsten, an alloy of titanium and tungsten, and an alloy of tantalum and tungsten, and where the seed layer has a body centered cubic lattice structure; and (2) a conductor layer formed upon the seed layer, where the conductor layer is formed of tantalum, and where the conductor layer also has a body centered cubic lattice structure.

In addition, Fontana Jr. et al., in U.S. Pat. No. 5,701,223, disclose a spin valve magnetoresistive (SVMR) sensor element with improved magnetoresistive (MR) properties, such as an enhanced magnetoresistive (MR) resistivity sensitivity, as well as improved chemical properties, such as an enhanced corrosion resistance of an antiferromagnetic pinning material layer within the spin valve magnetoresistive (SVMR) sensor element. The spin valve magnetoresistive (SVMR) sensor element realizes the foregoing objects by employing when forming the spin valve magnetoresistive (SVMR) sensor element: (1) a pair of anti-parallel antiferromagnetically biased ferromagnetic material layers separated by a non-magnetic conductor spacer layer to provide a composite pinned ferromagnetic layer within the spin valve magnetoresistive (SVMR) sensor element, in conjunction with; (2) a pinning material layer formed of a pinning material selected from the group consisting of nickel oxide, nickel-cobalt alloy oxides and iron-manganese-chromium alloys.

Further, Lee et al., in U.S. Pat. No. 5,731,936, disclose an anisotropic magnetoresistive (MR) sensor element, such as a soft adjacent layer (SAL) magnetoresistive (MR) sensor element, with an enhanced magnetoresistive (MR) resistivity sensitivity as well as an enhanced thermal stability. The anisotropic magnetoresistive (MR) sensor element employs a nickel-iron-chromium alloy or a nickel-chromium alloy spacer layer adjoining a nickel-iron alloy magnetoresistive (MR) layer formed within the anisotropic magnetoresistive (MR) sensor element.

Still further, Chang et al., in U.S. Pat. No. 5,763,108, disclose a high saturation magnetization magnetic material for use when fabricating a magnetic head, and a magnetic head fabricated employing the high saturation magnetization magnetic material for use when fabricating the magnetic head. The high saturation magnetization magnetic material has an elemental composition comprising about 40 to about 60 weight percent iron, about 40 to about 60 weight percent nickel and about 0.002 to about 1 percent tin.

Finally, Lin, in U.S. Pat. No. 5,768,071, discloses a spin valve magnetoresistive (SVMR) sensor element having an improved magnetic stability of a pinned ferromagnetic layer within the spin valve magnetoresistive (SVMR) sensor element. The spin valve magnetoresistive (SVMR) sensor element realizes the foregoing object by employing when forming the spin valve magnetoresistive (SVMR) sensor element a discontinuous nonmagnetic interlayer interposed between an antiferromagnetic pinning material layer and the pinned ferromagnetic layer within the spin valve magnetoresistive (SVMR) sensor element.

Desirable in the art of magnetoresistive (MR) sensor element fabrication are additional methods and materials which may be employed for forming with enhanced magnetoresistive (MR) resistivity sensitivity anisotropic magnetoresistive (MR) sensor elements, including in particular dual stripe magnetoresistive (DSMR) sensor elements.

It is towards the foregoing object that the present invention is directed.

SUMMARY OF THE INVENTION

A first object of the present invention is to provide a method for forming an anisotropic magnetoresistive (MR) sensor element, along with the anisotropic magnetoresistive (MR) sensor element formed employing the method.

A second object of the present invention is to provide a method and an anisotropic magnetoresistive (MR) sensor element in accord with the first object of the present invention, where the anisotropic magnetoresistive (MR) sensor element has an enhanced magnetoresistive (MR) resistivity sensitivity.

A third object of the present invention is to provide a method and an anisotropic magnetoresistive (MR) sensor element in accord with the first object of the present invention and the second object of the present invention, which method is readily commercially implemented.

In accord with the objects of the present invention, there is provided by the present invention a method for forming an anisotropic magnetoresistive (MR) sensor element, as well as the anisotropic magnetoresistive (MR) sensor element formed in accord with the method. To practice the method of the present invention, there is first provided a substrate. There is then formed over the substrate a seed layer, where the seed layer is formed of a magnetoresistive (MR) resistivity sensitivity enhancing material selected from the group consisting or nickel-chromium alloys and nickel-iron-chromium alloys. There is then formed over the seed layer a nickel oxide material layer. There is then formed over the nickel oxide material layer a magnetoresistive (MR) ferromagnetic layer.

The method of the present invention contemplates an anisotropic magnetoresistive (MR) sensor element fabricated in accord with the method of the present invention.

The present invention provides a method for forming an anisotropic magnetoresistive (MR) sensor element, and the anisotropic magnetoresistive (MR) sensor element formed employing the method, where the anisotropic magnetoresistive (MR) sensor element has an enhanced magnetoresistive (MR) resistivity sensitivity. The method of the present invention realizes the foregoing object by employing when forming the anisotropic magnetoresistive (MR) sensor element: (1) a seed layer formed of a magnetoresistive (MR) resistivity sensitivity enhancing material selected from the group consisting of nickel-chromium alloys and nickel-iron-chromium alloys, in turn having formed thereover; (2) a nickel oxide material layer, in turn having formed thereover; (3) a magnetoresistive (MR) ferromagnetic layer. While it is not entirely clear why an anisotropic magnetoresistive (MR) sensor element formed in accord with the present invention exhibits an enhanced magnetoresistive (MR) resistivity sensitivity, it is nonetheless clear that an anisotropic magnetoresistive (MR) sensor element formed in accord with the present invention exhibits an enhanced magnetoresistive (MR) resistive sensitivity in comparison with an analogous anisotropic magnetoresistive (MR) sensor formed otherwise in accord with the present invention, but absent a nickel oxide material layer formed interposed between: (1) a seed layer formed of a magnetoresistive (MR) resistivity sensitivity enhancing material selected from the group consisting of nickel-chromium alloys and nickel-iron-chromium alloys; and (2) a magnetoresistive (MR) ferromagnetic layer.

The method of the present invention is readily commercially implemented. The present invention employs methods and materials as are generally known in the art of magnetoresistive (MR) sensor element fabrication but employed within the context of specific locations and limitations within an anisotropic magnetoresistive (MR) sensor element to provide the present invention. Since it is a novel ordering and use of methods and materials which at least in part provides the present invention, rather than the existence of methods and materials which provides the present invention, the method of the present invention is readily commercially implemented.

BRIEF DESCRIPTION OF THE DRAWING

The objects, features and advantages of the present invention are understood within the context of the Description of the Preferred Embodiment, as set forth below. The Description of the Preferred Embodiment is understood within the context of the accompanying drawing, which forms a material part of this disclosure, wherein.

DESCRIPTION OF THE PREFERRED EMBODIMENT

Figure 1:
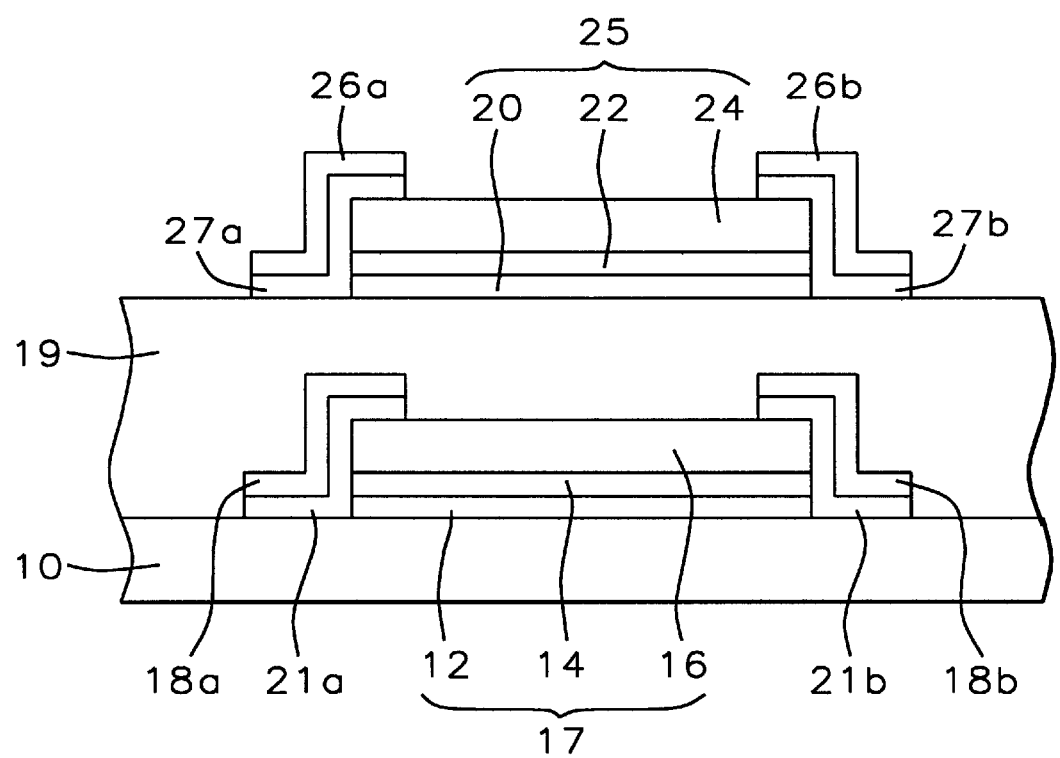
FIG. 1 shows a schematic air bearing surface (ABS) view diagram illustrating a dual stripe magnetoresistive (DSMR) sensor element fabricated in accord with a preferred embodiment of the present invention.

The present invention provides a method for forming an anisotropic magnetoresistive (MR) sensor element, along with the anisotropic magnetoresistive (MR) sensor element formed in accord with the method, where the anisotropic magnetoresistive (MR) sensor element has an enhanced magnetoresistive (MR) resistivity sensitivity. The present invention realizes the foregoing object by employing when forming the anisotropic magnetoresistive (MR) sensor element: (1) a seed layer formed of a magnetoresistive (MR) resistivity sensitivity enhancing material selected from the group consisting of nickel-chromium alloys and nickel-iron-chromium alloys, over which is formed; (2) a nickel oxide material layer, over which is formed; (3) a magnetoresistive (MR) ferromagnetic layer.

Although the preferred embodiment of the present invention illustrates the present invention within the context of fabricating a dual strip magnetoresistive (DSMR) sensor element which may be employed within digitally encoded magnetic data storage and retrieval while employing a direct access storage device (DASD) magnetic data storage enclosure, the present invention may also be employed for forming with enhanced magnetoresistive (MR) resistivity sensitivity anisotropic magnetoresistive (MR) sensor elements including but not limited to single stripe magnetoresistive (SSMR) sensor elements, soft adjacent layer (SAL) magnetoresistive (MR) sensor elements and dual stripe magnetoresistive (DSMR) sensor elements employed within: (1) digitally encoded magnetic data storage and transduction applications other than those employing direct access storage device (DASD) magnetic data storage enclosures; as well as (2) various analog magnetic data storage and transduction applications.

Referring now to FIG. 1, there is shown a schematic air bearing surface (ABS) view diagram illustrating a dual stripe magnetoresistive (DSMR) sensor element fabricated in accord with a preferred embodiment of the present invention.

Shown in FIG. 1 is a substrate 10 having formed thereover, among other layers, a first seed layer 12, which in turn has formed thereupon a first nickel oxide material layer 14, which in turn has formed thereupon a first magnetoresistive (MR) layer 16, where the three foregoing layers in the aggregate form a first magnetoresistive (MR) stack layer 17. Within the preferred embodiment of the present invention with respect to the substrate 10, the first seed layer 12, the first nickel oxide material layer 14 and the first magnetoresistive (MR) layer 16, each of the substrate 10, the first seed layer 12, the first nickel oxide material layer 14 and the first magnetoresistive (MR) layer 16 may be formed employing methods and materials as are either generally known or conventional in the art of magnetoresistive (MR) sensor element fabrication, although, as discussed below, some aspects of the first nickel oxide material layer 14 are presumably neither generally known nor conventional in the art of magnetoresistive (MR) sensor element fabrication.

For example, although it is known in the art of magnetoresistive (MR) sensor element fabrication that substrates are typically formed from non-magnetic ceramic materials such as but not limited to oxides, nitrides, borides and carbides, as well as homogeneous and heterogeneous mixtures of oxides, nitrides, borides and carbides, for the preferred embodiment of the present invention, the substrate 10 is preferably formed from a non-magnetic aluminum oxide-titanium carbide ceramic material, where the upper surface of the substrate 10, although not specifically illustrated within the schematic cross-sectional diagram of FIG. 1, typically and preferably has formed thereupon and thus incorporated therein a dielectric layer, typically and preferably (although not exclusively) formed of an aluminum oxide material, upon which dielectric layer is formed the first seed layer 12. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval, although, as noted above, an anisotropic magnetoresistive (MR) sensor element fabricated in accord with the present invention, such as the dual stripe magnetoresistive (MR) sensor element fabricated in accord with the preferred embodiment of the present invention, may be employed within other digitally encoded magnetic data storage and transduction applications, as well as analog magnetic data storage and transduction applications.

Specifics of fabrication of an anisotropic magnetoresistive (MR) sensor element, such as the dual stripe magnetoresistive (DSMR) sensor element of the preferred embodiment of the present invention, into a direct access storage device (DASD) magnetic data storage enclosure employed within digitally encoded magnetic data storage and retrieval are generally conventional in the art of direct access storage device (DASD) magnetic data storage enclosure fabrication and are thus not provided here. Such details may be found, however, within various portions of the prior art references cited within the Description of the Related Art, all of the teachings of which prior art references are incorporated herein fully by reference.

Within the preferred embodiment of the present invention with respect to the first seed layer 12, the first seed layer 12 is formed of a material which enhances the magnetoresistive (MR) resistivity sensitivity of the dual stripe magnetoresistive (DSMR) sensor element whose schematic air bearing surface (ABS) view diagram is illustrated within FIG. 1. Within the preferred embodiment of the present invention, it has been determined experimentally that the first seed layer 12 is preferably formed of either: (1) a nickel-iron-chromium alloy of nickel:iron:chromium weight ratio from about 64:16:20 to about 40:10:50, more preferably from about 53:12:35 to about 44:11:45; or (2) a nickel-chromium alloy of nickel:chromium weight ratio from about 80:20 to about 50:50, more preferably from about 65:35 to about 55:45, under conditions where at least a portion of the first magnetoresistive (MR) layer 16 which is closer to the first seed layer 12 is preferably formed of a nickel-iron (permalloy) alloy of nickel:iron weight ratio from about 70:30 to about 90:10, more preferably from about 77:23 to about 85:15. Typically and preferably, the first seed layer 12 is formed to a thickness of from about 30 to about 100 angstroms.

Within the preferred embodiment of the present invention, the portion of the first magnetoresistive (MR) layer 16 which is closer to the first seed layer 12, or alternatively the first magnetoresistive (MR) layer 16 in its entirety, may also be formed of other magnetoresistive (MR) ferromagnetic materials (in place of the nickel-iron (permalloy) alloys whose compositions are noted above) while still providing enhanced magnetoresistive (MR) resistivity sensitivity of the dual stripe magnetoresistive (DSMR) sensor element whose schematic air bearing surface (ABS) view diagram is illustrated in FIG. 1. Such other magnetoresistive (MR) ferromagnetic materials which may be employed for forming the first magnetoresistive (MR) layer 16 may include, but are not limited to, nickel ferromagnetic materials, iron ferromagnetic materials, cobalt ferromagnetic materials, alloys thereof, laminates thereof and laminates of alloys thereof, which have compositions such that lattice parameters of the first seed layer 12 and portion of the first magnetoresistive (MR) layer 16 which is closer to the first seed layer 12 are closely approximate or match.

Within the preferred embodiment of the present invention with respect to the first nickel oxide material layer 14, the first nickel oxide material layer 14 may be formed employing methods as are known in the art of magnetoresistive (MR) sensor element fabrication to provide the first nickel oxide material layer 14 which is particularly thin, preferably in a range of from about 5 to about 15 angstroms. Such methods may include, but are not limited to chemical vapor deposition (CVD) methods and physical vapor deposition (PVD) sputtering methods. It is believed within the present invention that such a particularly thin first nickel oxide material layer 14 is, in comparison with antiferromagnetic dielectric nickel oxide material layers typically formed to substantially greater thicknesses of generally at least about 100 angstroms, formed instead as a nonmagnetic dielectric first nickel oxide material layer 14. It is further believed that such a particularly thin nonmagnetic dielectric first nickel oxide material layer 14 in accord with the present invention and preferred embodiment of the present invention provides for enhanced specular electron scattering within anisotropic magnetoresistive (MR) sensor elements, such as the dual stripe magnetoresistive (DSMR) sensor element in accord with the preferred embodiment of the present invention, and consequently thus also provides an additional enhancement to a magnetoresistive (MR) resistivity sensitivity of an anisotropic magnetoresistive (MR) sensor element fabricated in accord with the present invention.

More preferably, within the preferred embodiment of the present invention, the first nickel oxide material layer 14 formed to the thickness of from about 5 to about 15 angstroms is formed employing a reactive radio frequency sputtering method employing a nickel target and an argon/oxygen mixture sputtering atmosphere. Preferably, the reactive radio frequency sputtering method also employs: (1) a reactor chamber pressure of about 3 to about 10 mtorr; (2) a source radio frequency power of from about 250 to about 750 watts at a source radio frequency of 13.56 MHZ, and a bias power of up to about 50 watts; (3) a substrate 10 temperature of from about 20 to about 100 degrees centigrade; (4) an argon/oxygen mixture flow rate of from about 30 to about 100 standard cubic centimeters per minute (sccm); and (5) an oxygen content within the argon/oxygen mixture of from about 3 to about 15 volume percent, to provide the first nickel oxide material layer 14 of nickel::oxygen atomic ratio of from about 1:0.2 to about 0.8:1.

Within the preferred embodiment of the present invention with respect to the first magnetoresistive (MR) layer 16, beyond the preference as disclosed above that at least a portion of the first magnetoresistive (MR) layer 16 close to the first seed layer 12 is under certain circumstances preferably formed of a nickel-iron (permalloy) alloy ferromagnetic material (or the enumerated alternative ferromagnetic materials, provided similarity of lattice parameters), the first magnetoresistive (MR) layer 16 may, as noted above, otherwise be formed of a magnetoresistive (MR) ferromagnetic material, or an aggregate of magnetoresistive (MR) ferromagnetic materials, as is conventionally employed for forming magnetoresistive (MR) layers within anisotropic magnetoresistive (MR) sensor elements as are conventional in the art of magnetoresistive (MR) sensor element fabrication. Such magnetoresistive (MR) ferromagnetic materials typically include, but are not limited to nickel ferromagnetic materials, iron ferromagnetic materials and cobalt ferromagnetic materials, as well as alloys thereof, laminates thereof and laminates of alloys thereof. For the preferred embodiment of the present invention, the first magnetoresistive (MR) layer 16 is preferably formed of the nickel-iron alloy layer of composition as described above and of thickness from about 30 to about 100 angstroms formed upon the first nickel oxide material layer 14.

Shown also within the schematic air bearing surface (ABS) view of FIG. 1 is a pair of first conductor lead layers 18a and 18b formed over a pair of opposite ends of the first magnetoresistive (MR) stack layer 17, where as illustrated within the schematic air bearing surface (ABS) view diagram of FIG. 1 the pair of first conductor lead layers 18a and 18b typically and preferably has formed therebeneath and preferably actually contacting the pair of opposite ends of the first magnetoresistive (MR) stack layer 17 a pair of first longitudinal magnetic biasing layers 21a and 21b which in turn have formed thereupon the pair of first conductor lead layers 18a and 18b.

Within the preferred embodiment of the present invention with respect to the pair of first longitudinal magnetic biasing layers 21a and 21b as illustrated within the schematic air bearing surface (ABS) view diagram of FIG. 1, although it is known in the art of anisotropic magnetoresistive (MR) sensor element fabrication that longitudinal magnetic biasing layers may be formed of: (1) antiferromagnetic exchange coupling magnetic materials (such as but not limited to iron-manganese alloy antiferromagnetic exchange coupling magnetic materials, nickel-manganese alloy antiferromagnetic exchange coupling magnetic materials, platinum-manganese alloy antiferromagnetic exchange coupling magnetic materials, iridium-manganese alloy antiferromagnetic exchange coupling magnetic materials and higher order alloys incorporating iron-manganese alloy antiferromagnetic exchange coupling magnetic materials, nickel-manganese alloy antiferromagnetic exchange coupling magnetic materials, platinum-manganese alloy antiferromagnetic exchange coupling magnetic materials and iridium-manganese alloy antiferromagnetic exchange coupling magnetic materials); as well as (2) permanent magnet hard magnetic materials (such as but not limited to cobalt-platinum permanent magnet hard magnetic materials and higher order alloys incorporating cobalt-platinum permanent magnet hard magnetic materials), for the preferred embodiment of the present invention, the pair of first longitudinal magnetic biasing layers 21a and 21b as illustrated within the schematic air bearing surface (ABS) view diagram of FIG. 1 is preferably formed of a platinum-manganese alloy antiferromagnetic exchange coupling magnetic material of platinum:manganese atomic ratio from about 40:60 to about 50:50, formed to a thickness of from about 150 to about 300 angstroms directly upon the pair of opposite ends of the first magnetoresistive (MR) stack layer 17.

Similarly, within the preferred embodiment of the present invention with respect to the pair of first conductor lead layers 18a and 18b, the pair of first conductor lead layers 18a and 18b may be formed employing conductor lead materials as are conventional in the art of magnetoresistive (MR) sensor element fabrication, such conductor lead materials including but not limited to gold, gold alloy, silver, silver alloy, copper and copper alloy conductor lead materials. For the preferred embodiment of the present invention, each first conductor lead layer 18a or 18b within the pair of first conductor lead layers 18a and 18b is preferably formed of a gold and tantalum laminated conductor lead material, preferably formed to a thickness of from about 200 to about 1000 angstroms, while encapsulating the pair of first longitudinal magnetic biasing layers 21a and 21b in turn formed upon the pair of opposite ends of the first magnetoresistive (MR) stack layer 17 as illustrated in part within the schematic air bearing surface (ABS) view diagram of FIG. 1, and thus defining a trackwidth of the first magnetoresistive (MR) stack layer 17 whose schematic air bearing surface (ABS) view diagram is illustrated in FIG. 1 of from about 0.5 to about 2.0 microns.

Shown also within the schematic air bearing surface (ABS) view diagram of FIG. 1 is an inter-stripe non-magnetic dielectric layer 19 formed encapsulating exposed portions of the substrate 10, the first longitudinal magnetic biasing layers 21a and 21b, the first conductor lead layers 18a and 18b and the first magnetoresistive (MR) layer 16 within the first magnetoresistive (MR) stack layer 17. Methods and materials which may be employed for forming inter-stripe non-magnetic dielectric layers within dual strip magnetoresistive (DSMR) sensor elements are known in the art of dual stripe magnetoresistive (DSMR) sensor element fabrication. Inter-stripe non-magnetic dielectric layers may be formed within dual stripe magnetoresistive (DSMR) sensor elements employing methods including but not limited to chemical vapor deposition (CVD) methods, plasma enhanced chemical vapor deposition (PECVD) methods and physical vapor deposition (PVD) sputtering methods to form inter-stripe non-magnetic dielectric layers of non-magnetic dielectric materials including but not limited to silicon oxide non-magnetic dielectric materials, silicon nitride non-magnetic dielectric materials and aluminum oxide non-magnetic dielectric materials. For the preferred embodiment of the present invention, the inter-stripe non-magnetic dielectric layer 19 is typically and preferably formed of an aluminum oxide non-magnetic dielectric material, formed to a thickness of from about 300 to about 800 angstroms passivating the exposed surfaces of the substrate 10, the first longitudinal magnetic biasing layers 21a and 21b, the first conductor lead layers 18a and 18b and the first magnetoresistive (MR) layer 16 within the first magnetoresistive (MR) stack layer 17, as is otherwise generally conventional in the art of dual stripe magnetoresistive (DSMR) sensor element fabrication.

Finally, there is also shown within the schematic air bearing surface (ABS) view diagram of FIG. 1 formed upon the inter-stripe non-magnetic dielectric layer 19 a second seed layer 20 in turn having formed aligned thereupon a second nickel oxide material layer 22 in turn having formed aligned thereupon a second magnetoresistive (MR) layer 24 to thus form a second magnetoresistive (MR) stack layer 25, where there is formed upon a pair of opposite ends of the second magnetoresistive (MR) stack layer 25 a pair of second longitudinal magnetic biasing layers 27a and 27b having formed aligned thereupon a pair of second conductor lead layers 26a and 26b.

Within the preferred embodiment of the present invention with respect to the second seed layer 20, the second seed layer 20 is typically and preferably formed employing methods, materials and dimensions analogous or equivalent to the methods, materials and dimensions employed for forming the first seed layer 12. Similarly, within the preferred embodiment of the present invention with respect to the second nickel oxide material layer 22, the second nickel oxide material layer 22 is typically and preferably formed employing methods, materials and dimensions analogous or equivalent to the methods, materials and dimensions employed for forming the first nickel oxide material layer 14. Yet similarly, within the preferred embodiment of the present invention with respect to the second magnetoresistive (MR) layer 24, the second magnetoresistive (MR) layer 24 is typically and preferably formed employing methods, materials and dimensions analogous or equivalent to the methods, materials and dimensions employed for forming the first magnetoresistive (MR) layer 16. Still yet similarly, within the preferred embodiment of the present invention with respect to the pair of second longitudinal magnetic biasing layers 27a and 27b, the pair of second longitudinal magnetic biasing layers 27a and 27b is typically and preferably formed employing methods, materials and dimensions analogous or equivalent to the methods, materials and dimensions employed for forming the pair of first longitudinal magnetic biasing layers 21a and 21b. Finally, within the preferred embodiment of the present invention with respect to the pair of second conductor lead layers 26a and 26b, the pair of second conductor lead layers is typically and preferably formed employing methods, materials and dimensions analogous or equivalent to the methods, materials and dimensions employed for forming the pair of first conductor lead layers 18a and 18b.

Upon forming the dual stripe magnetoresistive (DSMR) sensor element whose schematic air bearing surface (ABS) view diagram is illustrated in FIG. 1, there is formed a dual stripe magnetoresistive (DSMR) sensor element with an enhanced magnetoresistive (MR) resistivity sensitivity. The dual stripe magnetoresistive (MR) sensor element exhibits the enhanced magnetoresistive (MR) resistivity sensitivity since there is employed when forming the dual stripe magnetoresistive (SVMR) sensor element: (1) a pair of seed layers formed of a magnetoresistive (MR) resistivity sensitivity enhancing material selected from the group consisting of nickel-chromium alloys and nickel-iron-chromium alloys, in turn having formed thereupon; (2) a corresponding pair of nickel oxide material layers, in turn having formed thereupon; (3) a corresponding pair of magnetoresistive (MR) ferromagnetic layers within the dual stripe magnetoresistive (DSMR) sensor element.

Although not specifically illustrated within the schematic air bearing surface (ABS) view diagram of FIG. 1, to be fully operational, the dual stripe magnetoresistive (DSMR) sensor element whose schematic air bearing surface (ABS) view diagram is illustrated within FIG. 1 must have magnetization directions of each of the first magnetoresistive (MR) layer 16 and the second magnetoresistive (MR) layer 24 aligned either in nominally parallel directions or nominally anti-parallel directions with respect to each other. Such magnetization directions may be obtained employing magnetically assisted thermal annealing methods (at temperatures of up to about 280 degrees centigrade for time periods of up to about 5 hours) with appropriate materials choices for the first magnetoresistive (MR) layer 16, the pair of first longitudinal magnetic biasing layers 21a and 21b, the second magnetoresistive (MR) layer 24 and the pair of second longitudinal magnetic biasing layers 27a and 27b.

As is understood by a person skilled in the art, the dual stripe magnetoresistive (DSMR) sensor element whose schematic air bearing surface (ABS) view diagram is illustrated in FIG. 1 may be further fabricated employing layers and structures as are conventional in the art of magnetoresistive (MR) sensor element fabrication to provide a dual stripe magnetoresistive (DSMR) sensor element which is fully functional within a magnetic data storage and transduction application within which is employed the dual stripe magnetoresistive (DSMR) sensor element. Such additional layers and structures may include, but are not limited shield layers and structures, passivation layers and structures, conductor contact layers and structures and inductive magnetic write pole layers and structures. Resulting from such additional layers and structures fabricated incorporating the dual stripe magnetoresistive (DSMR) sensor element whose schematic air bearing surface (ABS) view diagram is illustrated within FIG. 1 may be a magnetic head selected from the group including but not limited to magnetoresistive (MR) read only magnetic heads, merged inductive write magnetoresistive (MR) read magnetic heads (which employ a pertinent magnetic material layer as both a shield layer for isolating an anisotropic magnetoresistive (MR) sensor element within the merged inductive write magnetoresistive (MR) read magnetic head and as a magnetic inductor write pole layer within the merged inductive write magnetoresistive (MR) read magnetic head), and non-merged inductive magnetic write magnetoresistive (MR) read magnetic heads.

Similarly, in concert with that which is noted above, the present invention is not limited to forming with an enhanced magnetoresistive (MR) resistivity sensitivity only a dual stripe magnetoresistive (DSMR) sensor element, but may also be employed for forming with enhanced magnetoresistive (MR) resistivity sensitivity anisotropic magnetoresistive (MR) sensor elements including but not limited to single stripe magnetoresistive (SSMR) sensor elements, soft adjacent layer (SAL) magnetoresistive (MR) sensor elements and dual stripe magnetoresistive (DSMR) sensor elements. Such single stripe magnetoresistive (SSMR) sensor elements may be formed employing methods, materials and dimensions analogous or equivalent to the methods, materials and dimensions employed for forming the dual stripe magnetoresistive (DSMR) sensor element whose schematic air bearing surface (ABS) view diagram is illustrated within FIG. 1, but wherein layers beyond the inter-stripe non-magnetic dielectric layer 19 are not fabricated. Similarly such a soft adjacent layer (SAL) magnetoresistive (MR) sensor element may be fabricated employing methods and materials analogous or equivalent to the methods and materials employed for forming such a single stripe magnetoresistive (SSMR) sensor element, but wherein there is formed an additional magnetoresistive (MR) ferromagnetic layer adjacent the first magnetoresistive (MR) layer 16 but separated from the first magnetoresistive (MR) layer 16 by a non-magnetic spacer layer (which may be either a dielectric non-magnetic spacer layer or a conductor non-magnetic spacer layer). Under such circumstances, the additional magnetoresistive (MR) ferromagnetic layer may be formed beneath the first magnetoresistive (MR) stack layer 17, above the first magnetoresistive (MR) stack layer 17, or (given appropriate materials considerations) possibly interposed between any of the layers within the first magnetoresistive (MR) stack layer 17.

As is understood by a person skilled in the art, and in accord with the preferred embodiment of the present invention, such other anisotropic magnetoresistive (MR) sensor elements with enhanced magnetoresistive (MR) resistivity sensitivity are fabricated in accord with the present invention by employing: (1) a seed layer of a magnetoresistive (MR) resistivity sensitivity enhancing material selected from the group consisting of nickel-chromium alloys and nickel-iron-chromium alloys, in turn having formed thereupon; (2) a nickel oxide material layer, further in turn having formed thereupon; (3) a magnetoresistive (MR) ferromagnetic layer.

Finally, while the dual stripe magnetoresistive (MR) sensor element in accord with the preferred embodiment of the present invention is illustrated as having each of: (1) the pertinent first seed layer 12, first nickel oxide material layer 14 and first magnetoresistive (MR) layer 16; or (2) the pertinent second seed layer 20, second nickel oxide material layer 22 and second magnetoresistive (MR) layer 24, as a stack of layers one formed upon the other, more generally, within an anisotropic magnetoresistive (MR) sensor element formed in accord with the present invention, corresponding layers may be formed over each other rather than necessarily upon each other. Such layers when formed over each other may have formed interposed therebetween additional layers, such as, for example and without limitation, a non-magnetic conductor spacer layer.

EXAMPLES

There was obtained two aluminum oxide-titanium carbide substrates employed for fabricating magnetoresistive (MR) sensor elements. Each of the two aluminum oxide-titanium carbide substrates had formed thereupon an aluminum oxide dielectric layer of thickness about 3 microns.

There was formed upon the aluminum oxide dielectric layer formed upon a first of the two aluminum oxide-titanium carbide substrates a first magnetoresistive (MR) stack layer comprising: (1) a seed layer formed to a thickness of about 40 angstroms upon the aluminum oxide dielectric layer from a nickel-iron-chromium alloy of nickel:iron:chromium weight ratio about 48:12:40 while employing a magnetron sputtering method; (2) a nickel oxide material layer of thickness about 10 angstroms formed upon the seed layer from a nickel oxide material of nickel:oxygen atomic ratio about 1:1 formed employing a reactive radio frequency sputtering of a nickel target employing an argon/oxygen mixture of about 5 volume percent oxygen at a radio frequency power of about 300 watts and a reactor chamber pressure of about 5 mtorr; (3) a magnetoresistive (MR) ferromagnetic material layer formed to a thickness of about 65 angstroms upon the nickel oxide material layer from a nickel-iron alloy of nickel:iron weight ratio about 80:20 as was also formed while employing a magnetron sputtering method.

There was formed upon the aluminum oxide dielectric layer formed upon a second of the two aluminum oxide-titanium carbide substrates a second magnetoresistive (MR) stack layer otherwise equivalent to the first magnetoresistive (MR) stack layer, but without the nickel oxide material layer formed interposed between the seed layer and the magnetoresistive (MR) ferromagnetic material layer.

There was then formed upon a pair of opposite ends of the first magentoresistive (MR) stack layer formed over the first aluminum oxide-titanium carbide substrate and the second magnetoresistive (MR) stack layer formed over the second aluminum oxide-titanium carbide substrate a corresponding pair of patterned antiferromagnetic coupling longitudinal magnetic biasing layers formed of a platinum-manganese alloy formed to a thickness of about 250 angstroms, where the pair of patterned antiferromagnetic coupling longitudinal magnetic biasing layers in turn had formed thereupon a pair of patterned conductor lead layers.

Each of the two aluminum oxide-titanium carbide substrates was then thermally annealed at a temperature of about 280 degrees centigrade for a time period of about 5 hours in an extrinsic magnetic bias field of about 2000 oersteds to fully align the pairs of antiferromagnetic exchange coupling longitudinal magnetic biasing layers and the corresponding magnetoresistive (MR) ferromagnetic material layers along a long axis.

There was then determined while employing conventional magnetization versus magnetic field measurements (i.e. hysteresis curve measurements), as well as other electrostatic measurements, various magnetic and electrical properties of the two magnetoresistive (MR) stack layers. The parameters included: (1) saturation magnetization (Bs); (2) coercivity field (Hc); (3) anisotropy field (Hk); (4) sheet resistance (Rs); (5) magnetostriction ($\lambda$s); (6) magnetoresistive (MR) resistivity sensitivity (dR/R); (7) a figure of merit (equal to sqrt(Rs)*(dR/R)/Bs); and (8) a figure of merit improvement. Values for the above measured and calculated parameters are reported in Table I, as follows.

TABLE I

|  | MR Stack w/NiOx | MR Stack w/o NiOx |
| --- | --- | --- |
| Saturation Magnetization, Bs (emu) | 0.521 | 0.537 |
| Coercivity, Hc (oersteds) | 1.85 | 1.49 |
| Anisotropy Field, Hk (oersteds) | 3.97 | 3.57 |
| Sheet Resistance, Rs (ohms/sq) | 29.24 | 33.34 |
| Magnetostriction, $\lambda$s | −5.0E-6 | −1.7E-6 |
| Resistivity Sensitivity, dR/R (percent) | 2.63 | 2.23 |
| Figure of Merit, sqrt Rs*(dR)/Bs | 0.273 | 0.240 |
| Figure of Merit Improvement (percent) | 13.8 | control |

As is seen from review of the data reported within Table I, there is observed a significant increase in magnetoresistive (MR) resistivity sensitivity for a magnetoresistive (MR) stack layer formed in accord with the present invention, as well as figure of merit and figure of merit improvement for such a magnetoresistive (MR) stack layer, in comparison with an otherwise equivalent magnetoresistive (MR) stack layer formed absent a nickel oxide material layer formed interposed between and contacting: (1) a seed layer formed of a magnetoresistive (MR) resistivity sensitivity enhancing material selected from the group consisting of nickel-chromium alloys and nickel-iron chromium alloys; and (2) a magnetoresistive (MR) ferromagnetic layer.

As is understood by a person skilled in the art, the preferred embodiment and examples of the present invention are illustrative of the present invention rather than limiting of the present invention. Revisions and modification may be made to methods, materials, structures and dimensions employed for forming an anisotropic magnetoresistive (MR) sensor element, such as but not limited to a dual stripe magnetoresistive (MR) sensor element in accord with the preferred embodiment of the present invention, while still providing an anisotropic magnetoresistive (MR) sensor element in accord with the spirit and scope of the present invention, as defined by the appended claims.

What is claimed is:

1. A method for forming an anisotropic magnetoresistive (MR) sensor element comprising:

providing a substrate;

forming over the substrate a double-layer seed layer, said double-layer seed layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said second material layer being a thin, non-magnetic dielectric nickel oxide material layer that additionally enhances magnetoresistive (MR) resistivity sensitivity;

forming over the double-layer seed layer a magnetoresistive (MR) ferromagnetic layer.

2. The method of claim 1 wherein the anisotropic magnetoresistive (MR) sensor element is selected from the group consisting of single stripe magnetoresistive (SSMR) sensor elements, soft adjacent layer (SAL) magnetoresistive (MR) sensor elements and dual stripe magnetoresistive (DSMR) sensor elements.

3. The method of claim 1 wherein the nickel oxide material layer, which is the second material layer of said double-layer seed layer, is formed to a thickness of from about 5 to about 15 angstroms as a non-magnetic dielectric nickel oxide material layer.

4. The method of claim 1 wherein the magnetoresistive (MR) ferromagnetic layer is formed of a ferromagnetic material selected from the group consisting of nickel, iron and cobalt ferromagnetic materials, alloys thereof, laminates thereof and laminates of alloys thereof.

5. An anisotropic magnetoresistive (MR) sensor element comprising:

a substrate;

a double-layer seed layer formed over the substrate, said double-layer seed layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said second material layer being a thin, non-magnetic dielectric nickel oxide material layer that additionally enhances magnetoresistive (MR) resistivity sensitivity; and a magnetoresistive (MR) ferromagnetic layer formed over the double-layer seed layer.

6. The anisotropic magnetoresistive (MR) sensor element of claim 5 wherein the anisotropic magnetoresistive (MR) sensor element is selected from the group consisting of single stripe magnetoresistive (SSMR) sensor elements, soft adjacent layer (SAL) magnetoresistive (MR) sensor elements and dual stripe magnetoresistive (DSMR) sensor elements.

7. The anisotropic magnetoresistive (MR) sensor element of claim 5 wherein the nickel oxide material layer, which is the second material layer of said double-layer seed layer, is formed to a thickness of from about 5 to about 15 angstroms as a non-magnetic dielectric nickel oxide material layer.

8. The anisotropic magnetoresistive (MR) sensor element of claim 5 wherein magnetoresistive (MR) ferromagnetic layer is formed of a ferromagnetic material selected from the group consisting of nickel, iron and cobalt ferromagnetic materials, alloys thereof, laminates thereof and laminates of alloys thereof.

9. A magnetoresistive (MR) head having incorporated therein an anisotropic magnetoresistive (MR) sensor element in accord with claim 5.

10. The magnetoresistive (MR) head of claim 9 wherein the magnetoresistive (MR) head is selected from the group consisting of magnetoresistive (MR) read only magnetic heads, merged inductive write magnetoresistive (MR) read magnetic heads and non-merged inductive write magnetoresistive (MR) read magnetic heads.

11. A magnetic data storage enclosure having incorporated therein a magnetoresistive (MR) head in accord with claim 9.

12. A method for forming a dual stripe anisotropic magnetoresistive (DSMR) sensor element comprising:
    providing a substrate;
    forming over the substrate a double-layer seed layer, said double layer seed layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity;
    forming over the double-layer seed layer a magnetoresistive (MR) ferromagnetic layer.

13. The method of claim 12 wherein the nickel oxide material layer, which is the second material layer of said double-layer seed layer, is formed to a thickness of from about 5 to about 15 angstroms as a non-magnetic dielectric nickel oxide material layer.

14. The method of claim 12 wherein the magnetoresistive (MR) ferromagnetic layer is formed of a ferromagnetic material selected from the group consisting of nickel, iron and cobalt ferromagnetic materials, alloys thereof, laminates thereof and laminates of alloys thereof.

15. The method of claim 12 further comprising:
    forming upon the magnetoresistive (MR) ferromagnetic layer a second double-layer seed layer, said second double-layer seed layer comprising a first material layer selected from the group of magnetoresistive (MR) resistivity sensitivity enhancing material consisting of nickel-chromium alloys and nickel-iron-chromium alloys and said second double-layer seed layer further comprising a second material layer, said second material layer being a thin, non-magnetic dielectric nickel oxide material layer that additionally enhances magnetoresistive (MR) resistivity sensitivity;
    forming upon the second double-layer seed layer a second magnetoresistive (MR) ferromagnetic layer.

16. The method of claim 15 wherein the nickel oxide material layer, which is the second material layer of said second double-layer seed layer, is formed to a thickness of from about 5 to about 15 angstroms as a non-magnetic dielectric nickel oxide material layer.

17. A dual stripe anisotropic magnetoresistive (DSMR) sensor element comprising:
    a substrate;
    a double-layer seed layer formed over the substrate, said double-layer seed layer comprising a first material layer selected from the group of magnetoresistive (MR) resistivity sensitivity enhancing material consisting of nickel-chromium alloys and nickel-iron-chromium alloys and said double-layer seed layer further comprising a second material layer, said material layer being a thin, non-magnetic dielectric nickel oxide material layer that additionally enhances magnetoresistive (MR) resistivity sensitivity; and
    a magnetoresistive (MR) ferromagnetic layer formed upon the double-layer seed layer.

18. The dual stripe magnetoresistive (DSMR) sensor element of claim 17 wherein the nickel oxide material layer, which is the second material layer of said double-layer seed layer, is formed to a thickness of from about 5 to about 15 angstroms as a non-magnetic dielectric nickel oxide material layer.

19. The dual stripe magnetoresistive (DSMR) sensor element of claim 17 wherein the magnetoresistive (MR) ferromagnetic layer is formed of a ferromagnetic material selected from the group consisting of nickel, iron and cobalt ferromagnetic materials, alloys thereof, laminates thereof and laminates of alloys thereof.

20. A magnetoresistive (MR) head having incorporated therein a dual stripe magnetoresistive (DSMR) sensor element in accord with claim 17.

21. The magnetoresistive (MR) head of claim 20 wherein the magnetoresistive (MR) head is selected from the group consisting of magnetoresistive (MR) read only magnetic heads, merged inductive write magnetoresistive (MR) read magnetic heads and non-merged inductive write magnetoresistive (MR) read magnetic heads.

22. A magnetic data storage enclosure having incorporated therein a magnetoresistive (MR) head in accord with claim 20.

23. The dual stripe magnetoresistive (DSMR) sensor element of claim 17 further comprising:
    a second double-layer seed layer formed over the magnetoresistive (MR) ferromagnetic layer, said second double-layer seed layer comprising a first material layer selected from the group of magnetoresistive (MR) resistivity sensitivity enhancing material consisting of nickel-chromium alloys and nickel-iron-chromium alloys and said second double-layer seed layer further comprising a second material layer, said material layer being a thin, non-magnetic dielectric nickel oxide material layer that additionally enhances magnetoresistive (MR) resistivity sensitivity; and
    a second magnetoresistive (MR) ferromagnetic layer formed upon the second double-layer seed layer.

24. The dual stripe magnetoresistive (DSMR) sensor element of claim 23 wherein the nickel oxide material layer, which is the second material layer of said second double-layer seed layer, is formed to a thickness of from about 5 to about 15 angstroms as a non-magnetic dielectric nickel oxide material layer.

* * * * *